United States Patent [19]

Miyamoto et al.

[11] Patent Number: 4,792,927
[45] Date of Patent: Dec. 20, 1988

[54] SEMICONDUCTOR MEMORY DEVICE WITH BIT LINE SENSE AMPLIFIERS

[75] Inventors: Hiroshi Miyamoto; Michihiro Yamada, both of Hyogo, Japan

[73] Assignee: Mitsubishi Denki Kabushiki Kaisha, Tokyo, Japan

[21] Appl. No.: 20,192

[22] Filed: Feb. 26, 1987

[30] Foreign Application Priority Data

Feb. 26, 1986 [JP] Japan .................................. 61-41281

[51] Int. Cl.⁴ .............................................. G11C 7/00
[52] U.S. Cl. .................................... 365/189; 365/149; 365/210
[58] Field of Search ................ 365/149, 189, 190, 202, 365/203, 210

[56] References Cited

U.S. PATENT DOCUMENTS

| | | | |
|---|---|---|---|
| 4,584,672 | 4/1986 | Schutz et al. | 365/203 |
| 4,598,387 | 7/1986 | Chwang et al. | 365/149 |
| 4,651,306 | 3/1987 | Yanagisawa | 365/210 |

FOREIGN PATENT DOCUMENTS 101093 6/1984 Japan .

OTHER PUBLICATIONS

Digest of Technical Papers, ISSCC, 1984, pp. 278–279, Roger I. Kung et al. "A Sub 100ns 256K DRAM in CMOS III Technology."

Primary Examiner—Joseph A. Popek
Attorney, Agent, or Firm—Lowe, Price, LeBlanc, Becker & Shur

[57] ABSTRACT

In a dynamic random access memory with a folded bit line structure, in which a memory cell array is divided into a plurality of blocks (CAL1, CAL2) and the bit lines (BL1, $\overline{BL1}$, BL2, $\overline{BL2}$) of the adjacent blocks (CAL1, CAL2) are connected to each other by using transfer gate transistors (QT1, QT2), sense amplifiers (SA1, SA2) and restore circuits (RE1, RE2) for detecting potential difference between pair of bit lines are provided for each of the pairs of bit lines (BL1, $\overline{BL1}$, BL2, $\overline{BL2}$) of each of the blocks (CAL1, CAL2), the transfer gate transistors (QT1, QT2) to turned on by being triggered by an activating signal to a restore circuit first operated, out of restore circuits connected to bit lines connected to the transfer gate transistor (QT1, QT2).

8 Claims, 8 Drawing Sheets

SEMICONDUCTOR MEMORY DEVICE WITH BIT LINE SENSE AMPLIFIERS

BACKGROUND OF THE INVENTION

1. Field of the Invention

The present invention relates to a large scale integrated semiconductor memory, and more particularly, it relates an improvement of a structure of a bit line portion in a dynamic random access memory with a folded bit line structure formed by a CMOS process.

2. Description of the Prior Art

A dynamic random access memory (referred to as a dynamic RAM hereinafter) generally comprises a plurality of memory cells, each memory cell comprising a transistor and a capacitor. In this case, the smaller the ratio of capacitance of a bit line to capacitance of a capacitor in a memory cell is, the larger amount of change in potential on a bit line at the time of read-out is, and correspondingly the larger input potential difference for a sense amplifier is, so that read-out operation of stored information is ensured. However, as capacity of a memory (memory device) is largely increased and integration thereof increases, the size of a memory cell becomes smaller, so that capacitance of a memory cell is reduced. On the other hand, since the number of memory cells connected to a single bit line increases, a bit line becomes longer, so that capacitance of a bit line tends to increase. As a result, the ratio of capacitance of a bit line to capacitance of a memory cell increases, and correspondingly an amount of change in potential on a bit line is reduced, so that read-out operation of stored information may not be ensured. To solve this problem, a single bit line is divided into a plurality of blocks so that the ratio of capacitance of a memory cell and capacitance of a bit line may be reduced.

FIG. 1 is a diagram showing a structure of a part of a conventional dynamic RAM, which is disclosed, for example, in an article of Digest of Tehhnical Papers, ISSCC '84, pp. 278-279. In FIG. 1, a so-called shared sense amplifier structure is shown wherein a bit line is divided into two parts and a sense amplifier is shared with each pair of divided bit lines. In addition, in the above described document, a transistor in a memory cell comprises a p channel MOS transistor, a sense amplifier comprises only a p channel MOS transistor, and a restore circuit comprises only an n channel MOS transistor. For simplicity, the conductivity type of these transistors is inverted and the structure thereof is slightly simplified in FIG. 1.

In FIG. 1, a pair of bit lines of a folded bit line structure are divided into three blocks, and comprises a bit line comprising divided bit lines BL1, BLN and BL2 and a complementary bit line comprising divided bit lines $\overline{BL1}$, $\overline{BLN}$ and $\overline{BL2}$. A sense amplifier SA for detecting potential difference on the pair of divided bit lines and amplifying the potential difference is connected to the pair of divided bit lines BLN and $\overline{BLN}$. The pair of divided bit lines BL1 and $\overline{BL1}$ are connected to a first restore circuit RE1 for further boosting the potential on the divided bit line at a higher potential of the pair of divided bit lines BL1 and $\overline{BL1}$, while the pair of divided bit lines BL2 and $\overline{BL2}$ are connected to a second restore circuit RE2.

The sense amplifier SA comprises an n channel MOS transistor QN1 having a drain connected to the divided bit line BLN, a gate connected to the divided bit line $\overline{BLN}$ and a source connected to a sense amplifier driver transistor QN5, and an n channel MOS transistor QN2 having a gate connected to a divided bit line BLN, a drain connected to the divided bit line $\overline{BLN}$ and a source connected to one conduction terminal of the sense amplifier driver transistor QN5. The sense amplifier driver transistor QN5 has a gate receiving an activating signal SN and other conduction terminal connected to a ground potential $V_{SS}$. The sense amplifier SA is activated when the sense amplifier driver transistor QN5 is turned on, so that the potential on the bit line at a lower potential in the pair of bit lines BLN and $\overline{BLN}$ is brought close to the ground potential $V_{SS}$.

The first restore circuit RE1 connected to the pair of divided bit lines BL1 and $\overline{BL1}$ comprises a p channel MOS transistor QP1 having a drain connected to the divided bit line BL1, a gate connected to the complementary divided bit line $\overline{BL1}$ and a source connected to one conduction terminal of a restore circuit driver transistor QP5, and a p channel MOS transistor QP2 having a drain connected to the complementary divided bit line $\overline{BL1}$, a gate connected to the divided bit line BL1 and a source connected to one conduction terminal of the restore circuit driver transistor QP5. The restore circuit driver transistor QP5 comprises a p channel MOS transistor having other conduction terminal connected to a power supply potential $V_{CC}$ and a gate receiving a restore circuit activating signal SP1. The first restore circuit RE1 is responsive to an on-state of the restore circuit driver transistor QP5 for boosting the potential on the divided bit line at a higher potential in the pair of divided bit lines BL1 and $\overline{BL1}$ to the power supply potential $V_{CC}$.

The second restore circuit RE2 connected to the pair of divided bit lines BL2 and $\overline{BL2}$ comprises a p channel MOS transistor QP3 having a drain connected to the divided bit line $\overline{BL2}$, a gate connected to the complementary divided bit line BL2 and a source connected to one conduction terminal of a restore circuit driver transistor QP6, and a p channel MOS transistor QP4 having a drain connected to the complementary divided bit line $\overline{BL2}$, a gate connected to the divided bit line BL2 and a source connected to one conduction terminal of the restore circuit driver transistor QP6. The restore circuit driver transistor QP6 comprises a p channel MOS transistor having other conduction terminal connected to the power supply potential $V_{CC}$ and a gate receiving a second restore circuit activating signal SP2. The second restore circuit RE2 boosts the potential on the divided bit line at a higher potential in the pair of divided bit lines BL2 and $\overline{BL2}$ to the power supply potential $V_{CC}$.

The divided bit lines BL1 and BLN are connected to each other through a transfer gate transistor QT1, while the complementary divided bit lines $\overline{BL1}$ and $\overline{BLN}$ are connected to each other through a transfer gate transistor QT2. The transfer gate transistors QT1 and QT2 are turned on and off in response to a transfer signal T1 received at the gate thereof.

The divided bit lines BLN and BL2 are connected to each other through transfer gate transistor QT3, while the complementary divided bit lines $\overline{BLN}$ and $\overline{BL2}$ are connected to each other through a transfer gate transistor QT4. The transfer gate transistors QT3 and QT4 are turned on and off in response to a seoond transfer signal T2. The divided bit line BL1 is connected to a data bus line BU through a column gate transistor QY1, while the complementary divided bit line $\overline{BL1}$ is connected to a complementary data bus line $\overline{BU}$ thruugh a column gate transistor QY2. The column gate transistors QY1 and QY2 are turned on and off in response to a column selecting signal Y at the gates thereof.

Although a plurality of memory cells are connected to each of divided bit lines, depending on memory capacity, only a memory cell MC1 connected to the divided bit line BL2 is typically shown. The memory cell MC1 comprises an n channel MOS transistor $Q_S$ and a capacitor $C_S$. The transistor $Q_S$ has one conduction terminal connected to the bit line BL2, a gate comprising a part of a word line WL1 and other conduction terminal connected to one electrode of the capacitor $C_S$. The capacitor $C_S$ has other terminal connected to a memory cell plate poteniial $V_{SG}$. The capacitor $C_S$ store information in the form of charges, and the transistor $Q_S$ is turned on in response to the potential on the word line WL1 to electrically connect the capacitor $C_S$ to the bit line BL2. FIG. 2 is a waveform diagram showing operation of a circuit shown in FIG. 1. However, FIG. 2 shows waveforms of operation when information "0" is stored in the memory cell MC1 of the circuit shown in FIG. 1, that is, when the capacitor $C_S$ in the memory cell MC1 is not charged. Referring now to FIGS. 1 and 2, circuit operation is simply described.

At the time t0, the transfer signal T1 becomes an "L" level. Accordingly, the transfer gate transistors QT1 and QT2 are turned off, so that the divided bit lines BLN and BL1 are electrically isolated, and also the complementary divided bit lines $\overline{BLN}$ and $\overline{BL1}$ are electrically isolated. Before the time t0, each of the divided btt lines BL1, $\overline{BL1}$, BL2, $\overline{BL2}$, BLN and $\overline{BLN}$ is precharged at an intermediate potential level $(V_{CC}-V_{SS})/2$.

At the time $t_1$, the word line WL1 is selected by signals from address decoder means (not shown) and the potential on the word line WL1 becomes an "H" level. Accordingly, the transistor $Q_S$ in the memory cell MC1 is turned on, so that information "0" stored in the capacitor $C_S$ is read out to the divieed bit line BL2. As a result, the potential on the divided bit line BL2 slightly lowers, so that potential difference occurs between the divided bit line BL2 and the complementary divided bit line $\overline{BL2}$.

At the time t2, a first sense amplifier activating signal SN becomes an "H" level. Accordingly, the sense amplifier SA is activated. As a result, potential difference is increased between the pair of divided bit lines BL2 and $\overline{BL2}$. More specifically, the sense amplifier driver transistor QN5 is rendered conductive in response to the first sense amplifier activating signal SN, so that sources of the transistors QN1 and QN2 in the sense amplifier SA are connected to the ground potential $V_{SS}$. Since the potential on the divided bit line BLN is lower than that on the complementary divided bit line $\overline{BLN}$ (the transfer gates QT3 and QT4 are rendered conductive because the second transfer signal T2 is at an "H" level), the divided bit line BLN, that is, the divided bit line BL2 is discharged through the transfer gate QT3 and the transistor QN1 in the sense amplifier SA, so that the potential thereon becomes near the ground potential $V_{SS}$. On the other hand, the potential on the complementary divided bit lines $\overline{BL2}$ and $\overline{BLN}$ is held near the intermediate potential $(\frac{1}{2}).(V_{CC}-V_{SS})$ because the transistor QN2 is almost turned off.

At the time t3, the second restore activating signal SP2 becomes an "L" level. Accordingly, the second restore circuit RE2 is activated, so that the potential on the complementary divided bit line $\overline{BL2}$ is pulled up near the power supply potential $V_{CC}$. As a result, potential difference is increased between the divided bit line BL2 and the complementary divided bit line $\overline{BL2}$. The operation of the restore circuit RE2 is identical to that of the sense amplifier SA with polarity thereof inverted. More specifically, the transistor QP4 is rendered conductive in response to the potential near the ground potential on the divided bit line BL2, and the complementary divided bit line $\overline{BL2}$ is charged, so that the potential thereon becomes near the power supply potential $V_{CC}$. As a result, potential difference is further increased between the pair of divided bit lines BL2 and $\overline{BL2}$.

At the time t4, the first transfer signal T1 becomes again an "H" level. Accordingly, the transfer gate transistors QT1 and QT2 are rendered conductive, so that the divided bit lines BLN and BL1 as well as the complementary divided bit lines $\overline{BLN}$ and $\overline{BL1}$ are connected to each other, respectively. Therefore, the potentials on the divided bit line BLN and the complementary divided bit line $\overline{BLN}$ are transferred to the divided bit line BL1 and the complementary divided bit line $\overline{BL1}$, respectively. As a result, the divided bit line BLN is discharged through the transfer gate transistor QT1 and the sense amplifier SA, so that the potential thereon becomes near the ground potential $V_{SS}$. On the other hand, the potential on the complementary divided bit line $\overline{BL1}$ is pulled up through the transfer gate transistors QT2 and QT4 and the restore circuit RE2.

At the time t5, the first restore circuit activating signal SP1 becomes an "L" level. Accordingly, the first restore circuit RE1 is activated, so that the potential on the complementary divided bit line BL1 is pulled up near the power supply potential $V_{CC}$.

At the time t6, a column selecting signal Y becomes an "H" level in response to an output of a column decoder circuit (not shown). Accordingly, the complementary divided bit line $\overline{BL1}$ and the divided bit line BL1 are connected to a complementary data bus line $\overline{BU}$ and a data bus line $\overline{BU}$, respectively. Then the potentials on the divided bit lines BL1 and $\overline{BL1}$ are transferred to the data bus lines BU and $\overline{BU}$, so that information "0" stored in the memory cell MC1 is read out.

In the foregoing, information stored in the capacitor $C_S$ in the memory cell MC1 is read out to the divided bit line BL2, so that potential difference between the pair of divided bit lines BL2 and $\overline{BL2}$ is amplified by the sense amplifier SA. Th divided bit line BL2 at a lower potential is discharged at the sense amplifier SA through a transfer gate transistor QT3, so that the potential thereon becomes near the ground potential $V_{SS}$. In the dynamic RAM with a folded bit line structure a bit line is generally formed of a low resistance material such as aluminum or refractory metal silicide. As a result, resistance of a bit line can be reduced and hence RC delay due to the bit line can be reduced, so that discharge of charges on the bit line can be accelerated.

However, in the dynamic RAM with a shared sense amplifier structure as described above, a transfer gate transistor is provided between a divided bit line connected to a memory cell and a sense amplifier, so that a bit line can not be formed of low resistance materials in this transistor portion. In addition, as shown in FIG. 1, since the transfer gate transistor must be provided for each divided bit line and for each pitch between bit lines (the sum of the bit line width and the spacing between bit lines), the transistor width can be made almost the same as or at most twice the pitch between bit lines.

Since the pitch between bit lines is, for example, about 3 μm in a 1 Mega-bit dynamic RAM, the transistor width of the transfer gate is limited to less than several μm. As a result, since the minimun value of the transistor length is limited in advance, trans-conductance $g_m$ of the transfer gate transistor in reduced, so that discharge of charges on the divided bit line is delayed when the sense amplifier operates.

Furthermore, since a source and a drain of the transfer gate transistor are formed of a diffusion layer provided in a substrate or a well, noise is transferred to a bit line through the substrate or the well, so that the sense amplifier erroneously operates due to the noise.

FIG. 3 is a diagram showing a part of a structure of another convetioanl dynamic random access memory, which is disclosed in the Japanese Laying-Open Gazette No. 101093/1984. In FIG. 3, a bit line is divided into three blocks and a circuit comprises only an n channel MOS transistor.

A first pair of divided bit lines BL4 and $\overline{BL4}$ are connected to a bit line precharge circuit BC which is activated in response to a reset signal RST for precharging each of divided bit lines BL4, BL5, BL6, $\overline{BL4}$, $\overline{BL5}$ and $\overline{BL6}$ to the intermediate potential $(V_{CC}-V_{SS})/2$. The bit lines BL4 and $\overline{BL4}$ are also connected to an active pull-up circuit AP responsive to a reset signal RST and an active pull-up signal APE for boosting the potential on the divided bit line at a higher potential of the pair of divided bit lines BL4 and $\overline{BL4}$ to the power supply potential $V_{CC}$ level.

Pairs of divide bit lines BL5 and $\overline{BL5}$ and BL6 and $\overline{BL6}$ are provided with memory cells, sense amplifiers SA5 and SA6, respectively. Although memory cells depending on a memory capacity are connected to the pairs of the divided bit lines BL5 and $\overline{BL5}$ and BL6 and $\overline{BL6}$, only a memory cell MC1 connected to the divided bit line BL5 is typically shown in FIG. 3.

The transfer gate transistors QT1 and QT4, which are turned on/off in response to a transfer signal BSC, are provided between the divided bit lines, respectively. The divided bit lines BL4 and $\overline{BL4}$ are connected to the data buses BU and $\overline{BU}$ through transfer gates QY1 and QY2, respectively.

The transfer gate transistors QY1 and QY2 for selecting column are turned on and off in response to the column selecting signal Y from an address decoder circuit (not shown).

Additionally, sense amplifiers SA5 and SA6 are activated in response to sense amplifier activating signals SN5 and SN6.

The memory cell MC1 comprises a transistor $Q_S$ and a capacitor $C_S$. The transistor $Q_s$ has a gate being a part of the word line WL1, one conduction terminal connected to the divided bit line BL5 and other conduction terminal connected to one electrode of the capacitor $C_S$. The capacitor $C_S$ has other electrode connected to a memory cell plate potential $V_{SG}$. The transistor $Q_S$ in the memory cell MC1 is rendered conductive in response to the potential applied to the word line WL1, so that the capacitor $C_S$ is electrically connected to the divided bit line BL5.

FIG. 4 is a waveform diagram showing operation of the circuit shown in FIG. 3, showing how data is read out when the capacitor $C_S$ in the memory cell MC1 is not charged, that is, when information "0" is stored. Referring now to FIGS. 3 and 4, the operation of the circuit shown in FIG. 3 is described.

Before the time t0, both the transfer signal BSC and the reset signal RST are at an "H" level, and all the transfer gate transistors QT1 to QT4 are turned on. Thus, the divided bit lines BL4, BL5 and BL6 are connected to each other, and the complementary divided bit lines $\overline{BL4}$, $\overline{Bl5}$ and $\overline{BL6}$ are connected to each other. In addition, since the reset signal RST is at an "H" level, the bit line precharge circuit BC is activated in response to the reset signal RST at an "H" level, so that each of the divided bit lines BL4, BL5, BL6, $\overline{BL4}$, $\overline{BL5}$ and $\overline{BL6}$ is precharged at the intermediate potential $(V_{CC}-V_{SS})/2$.

At the time t0, both the transfer signal BSC and the reset signal RST become an "L" level, and the transfer gate transistors QT1 to QT4 are turned off, so that each of the divided bit lines is isolated and the bit line precharge circuit BC is inactivated.

At the time t1, the potential on the selected word line WL1 becomes an "H" level in response to an output of an address decoder circuit (not shown). Accordingly, the transistor $Q_S$ in the memory cell MC1 is turned on, so that information stored in the capacitor $C_S$ is read out to the bit line BL5. As a result, the potential on the divided bit line BL5 slightly lowers, so that potential difference occurs between the pair of the divided bit lines BL5 and $\overline{BL5}$.

At the time t2, the sense amplifier activating signal SN5 becomes an "H" level. Accordingly, the sense amplifier SN5 is activated. As a result, potential difference is increased between the pair of the divided bit lines BL5 and $\overline{BL5}$.

At the time t3, the transfer signal BSC becomes an "H" level. Accordingly, all the transfer gate transistors QT1 to QT4 are turned on, so that the potentials on the divided bit line BL5 and the complementary divided bit line $\overline{BL5}$ are transferred to the divided bit lines BL4 and BL6 and the complementary divided bit lines $\overline{BL4}$ and $\overline{BL6}$, respectively.

At the time t4, the sense amplifier activating signal SN6 becomes an "H" level. Accordingly, the sense amplifier SA6 is activated. As a result, potential difference is increased between the pair of divided bit lines BL6 and $\overline{BL6}$ and thus, potential difference is further increased between the pairs of divided bit lines BL4 and $\overline{BL4}$ and BL5 and $\overline{BL5}$.

At the time t5, the active pull-up signal APE becomes an "H" level. Accordingly, the active pull-up circuit AP is activated. As a result, the potentials on the complementary divided bit lines $\overline{BL4}$, $\overline{BL5}$ and $\overline{BL6}$ are pulled up near the power supply potential $V_{CC}$.

When the column selecting signal Y from an address decoder circuit (not shown) becomes an "H" level, the gate transistors QY1 and QY2 for selecting column are turned on. Accordingly, the potentials on the divided bit line BL4 and the complementary divided bit line $\overline{BL4}$ are transferred to the data bus line BU and the complementary data bus line $\overline{BU}$, so that information "0" stored in the memory cell MC1 is read out.

As described in the foregoing, in the circuit shown in FIG. 3, a sense amplifier is provided for each pair of divided bit lines, while an active pull-up circuit is provided not for each pair of divided bit lines but for a pair of bit lines which constructs a folded bit line. Therefore, since the potential on an entire bit line must be pulled up by a single active pull-up circuit when the active pull-up circuit operates, the active pull-up circuit having large drive capacity is required. This increases the area occupied by the active pull-up circuit, which prevents high integration of a semiconductor memory.

Additionally, in order to pull up the potential on each of the divided bit lines or each of the complementary divided bit lines to the power supply potential $V_{CC}$ level, the gate potential applied to a transfer gate transistor, that is, an "H" level of the transfer signal BSC must be boosted over the power supply potential $V_{CC}$, in consideration of the threshold voltage of the transfer gate transistor which connects the divided bit lines and the complementary divided bit lines, respectively. However, as integration of a semiconductor memory device increases, a gate oxide film of the MOS transistor formed therein tends to be thinner. For example, the gate oxide film in a 1 Mega-bit dynamic RAM is approximately 200 to 300 Å in thickness. Therefore, if the gate potential is boosted over the power suppyy potential, dielectric breakdown or the like of the gate oxide film is caused, so that reliability of the gate oxide film is deteriorated.

As described in the foregoing, there are some problems in a bit line structure of the conventional semiconductor memory. For example, discharge of the (complementary) divided bit lines is delayed when the sense amplifier operates, so that fast operation of the memory is prevented. Since the structure is liable to be affected by noise on the bit line, it is difficult to increase operating margin of the semiconductor memory. In addition, reliability of the gate oxide film of the transfer gate transistor is deteriorated.

SUMMARY OF THE INVENTION

An object of the present invention is to solve the above described problems of the conventional semiconductor memory and to provide a semiconductor memory in which information is read out in a fast and stable manner, and a reliable gate oxide film is formed.

According to the present invention, a semiconductor memory having a folded bit line structure and a memory cell array divided into a plurality of blocks is characterized in that a sense amplifier and a restore circuit are provided for each pair of divided bit lines, and a transfer gate connected between the divided bit lines is turned on in response to signals generated by being triggered by signals for activating a restore circuit first operating out of restore circuits connected to a divided bit line connected to the transfer gate, respectively.

In the semiconductor memory according to the present invention, since a sense amplifier and a restore circuit provided for each pair of divided bit lines can surely amplify potential difference between the pair of divided bit lines including a divided bit line connected to a selected memory cell to improve the SN ratio of the read-out signal. In addition, since a transfer gate connected to the divided bit line is turned on by being triggered by a signal for activating a restore circuit which first operates among restore circuits included in each of the pair of divided bit lines connected thereto, the pair of divided bit lines can be discharged or charged without delay. As a result, reliable sense operation and fast read-out can be performed, so that operating margin of the semiconductor memory is increased. Furthermore, since each of the divided bit lines is boosted up to a power supply potential level by a restore circuit provided thereto, the gate potential applied to a transfer gate transistor connected to the divided bit lines need not be boosted over the power supply potential, so that reliability of the gate oxide film and thus, reliability of the semiconductor memory are improved.

These objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
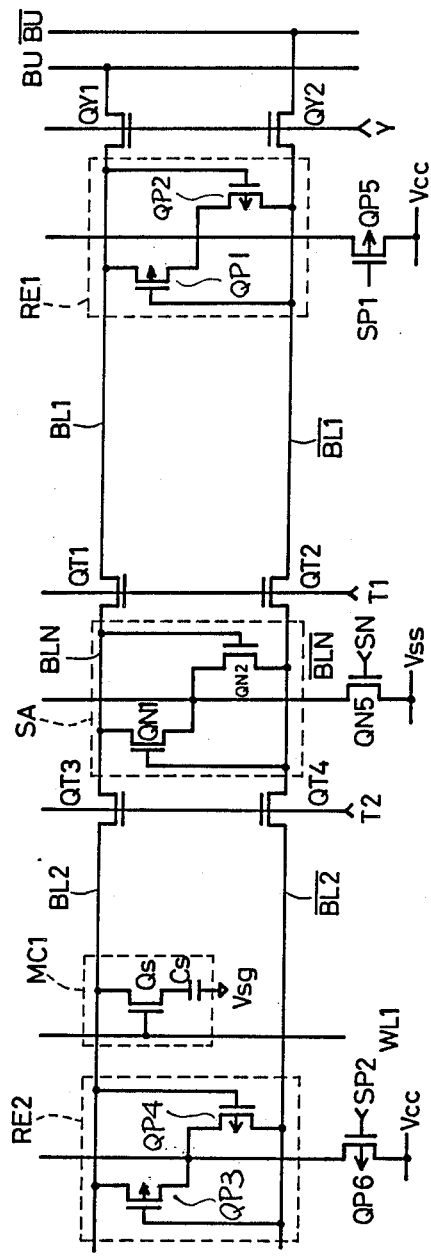
FIG. 1 is a diagram showing a structure of a conventional dynamic random access memory with a folded bit line structure.
Figure 2:
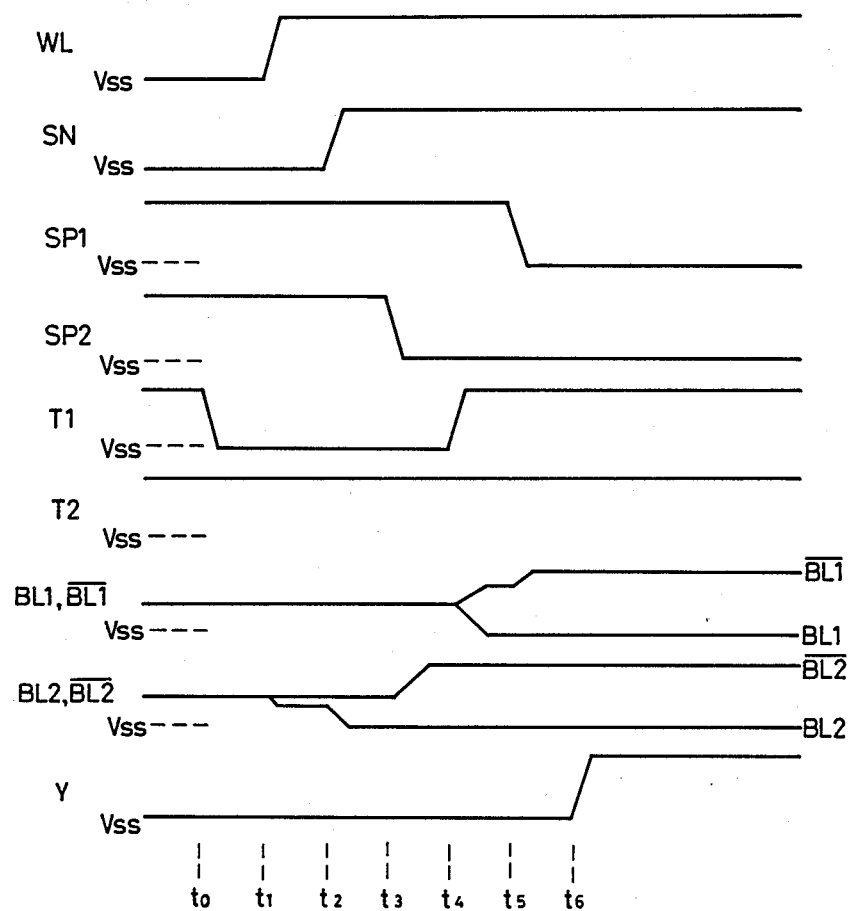
FIG. 2 is a waveform diagram showing operation of the dynamic random access memory shown in FIG. 1.
Figure 3:
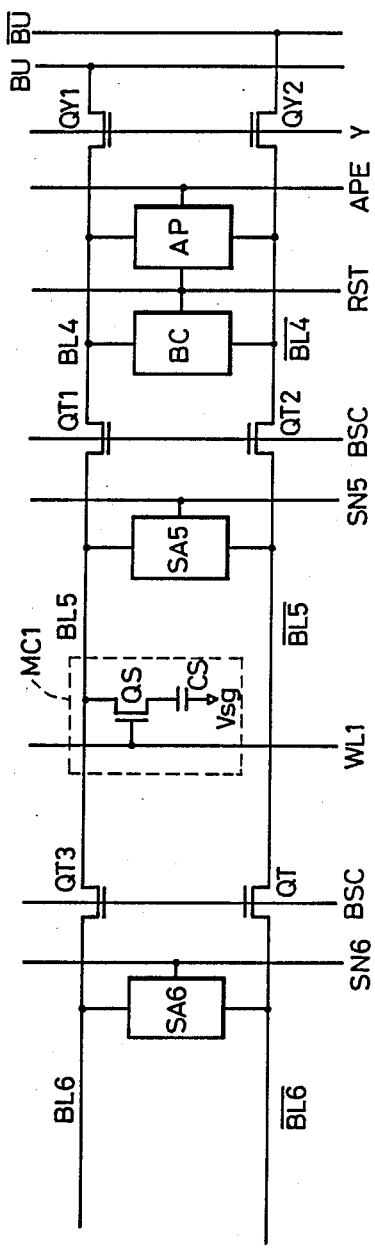
FIG. 3 is a diagram showing a structure of another conventional dynamic access memory with a folded bit line structure.

Referring now to the drawings, an embodiment of the present invention is described.

Figure 5:
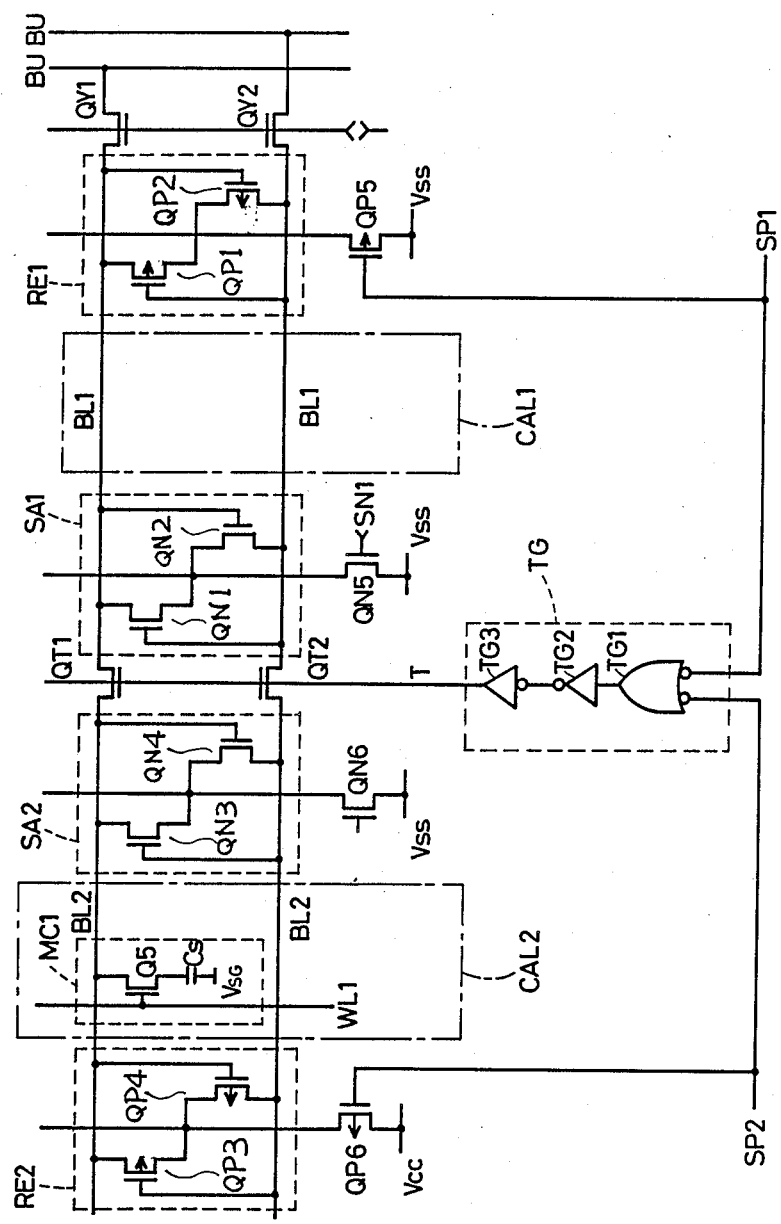
FIG. 5 is a diagram showing a structure of a dynamic random access memory according to an embodiment of the present invention.

FIG. 5 is a diagram showing a structure of a part of a dynamic random access memory according to an embodiment of the present invention. In FIG. 5, a pair of bit lines with a folded bit line structure are divided into a plurality of blocks, for example, two blocks in FIG. 5.

One pair of divided bit lines BL1 and $\overline{BL1}$ is connected to a sense amplifier SA1 for detecting and amplifying potential difference between the pair of divided bit lines BL1 and $\overline{BL1}$, and also connected to a restore circuit RE1 for detecting and further amplifying the potential difference amplified by the sense amplifier SA1.

The sense amplifier SA1 comprises an n channel MOS transistor QN1 having a drain connected to the bit line BL1, a gate connected to the complementary divided bit line $\overline{BL1}$ and a source connected to one conduction terminal of a sense amplifier driver transistor QN5, and an n channel MOS transistor QN2 having a drain connected to the complementary divided bit line $\overline{BL1}$, a gate connected to the divided bit line BL1 and a source connected to one conduction terminal of the sense amplifier driver transistor QN5. The sense amplifier driver transistor QN5 for activating the sense amplifier SA1 has other conduction terminal connected to a ground potential $V_{SS}$ and a gate receiving a sense amplifier activating signal SN1.

The restore circuit RE1 comprises a p channel MOS transistor QP1 having a drain connected to the divided bit line BL1, a gate connected to the complementary divided bit line $\overline{BL1}$ and a source connected to one conduction terminal of a restore circuit driver transistor QP5, and a p channel MOS transistor QP2 having a drain connected to the complementary divided bit line $\overline{BL1}$, a gate connected to the divided bit line BL1 and a source connected to one conduction terminal of the restore circuit driver transistor QP5. The restore circuit driver transistor QP5 has other conduction terminal connected to a power supply potential $V_{CC}$ and a gate receiving a restore circuit activating signal SP1.

The other pair of divided bit lines BL2 and $\overline{BL2}$ are connected to a sense amplifier SA2 for detecting and amplifying potential difference between the pair of divided bit lines BL2 and $\overline{BL2}$, and also connected to a retore circuit RE2 for detecting and further amplifying the potential difference amplified by the sense amplifier SA2.

The sense amplifier SA2 comprises an n channel MOS transistor QN3 having a drain connected to the divided bit line BL2, a gate connected to the complementary divided bit line $\overline{BL2}$ and a source connected to one conduction terminal of a sense amplifier driver transistor QN6, and an n channel MOS transistor QN4 having a gate connected to the complementary divided bit line $\overline{BL2}$, and a gate connected to the divided bit line BL2 and a source connected to one conduction terminal of the sense amplifier driver transistor QN6. The sense amplifier driver transistor QN6 which is an n channel MOS transistor has other conduction terminal connected to the ground potential $V_{SS}$ and a gate receiving a sense amplifer activating signal SN2.

The restore circuit RE2 comprises a p channel MOS transistor QP3 having drain connected to the divided bit line BL2, a gate connected to the complementary divided bit line $\overline{BL2}$ and a source connected to one conduction terminal of the restore circuit driver transistor QP6, and a p channel MOS transistor QP4 having a drain connected to the complementary divided bit line $\overline{BL2}$, a gate connected to the divided bit line BL2 and a source connected to one conduction terminal of the restore circuit driver transistor QP6. The restore circuit driver transistor QP6 which is a p channel MOS transistor has other conduction terminal conncected to the power supply potential $V_{CC}$ and a gate receiving a restore circuit activating signal SP2.

The divided bit lines BL1 and BL2 are connected to each other through a transfer gate transistor QT1, and the complementary divided bit lines are ccnnected to each other through a transfer gate transistor QT2. A transfer signal T is applied to the gates of the transfer gate transistors QT1 and QT2. The transfer signal T becomes an active level by being triggered by a restore circuit activating signal first being an active level out of the restore circuit activating signals SP1 and SP2. A transfer signal generator TG generating the transfer signal T comprises a circuit including an NAND gate TG1 receiving the restore circuit activating signals SP1 and SP2 for performing an NAND operation thereof. In FIG. 5, a structure comprising the NAND gate TG1 and two-stage inverter circuits TG2 and TG3 receiving the output of the NAND gate TG1 for inverting it is shown by way of an example.

The pair of divided bit lines BL1 and $\overline{BL1}$ and data bus lines BU and $\overline{BU}$ for transferring read-out information are connected to each other by column gate transistors QY1 and QY2, respectively. The column gate transistors QY1 and QY2 has gates receiving a column selecting signal Y from an address decoder circuit (not shown).

Figure 4:
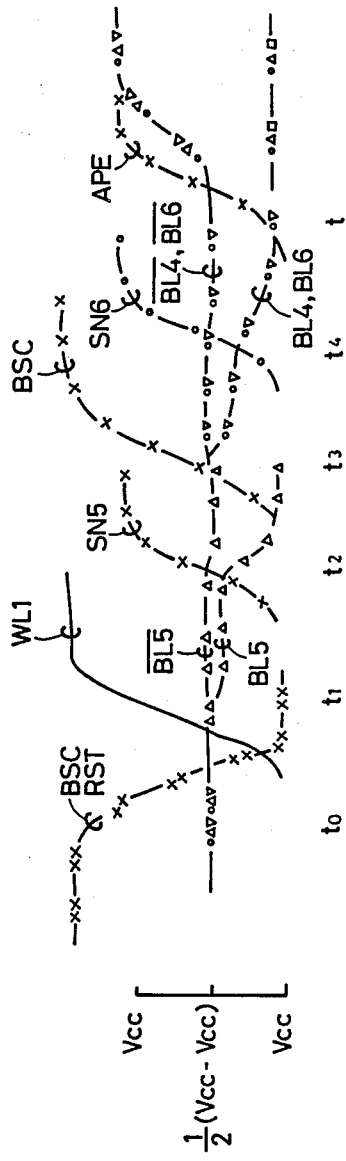
FIG. 4 is a waveform diagram of signals showing operation of the dynamic random access memory shown in FIG. 3.

Memory cells are connected to each pair of divided bit lines, depending on memory capacity, so that divided memory cell arrays CAL1 and CAL2 are formed, respectively. In FIG. 4, only a memory cell MC1 connected to the divided bit line BL2 is typically shown. Tee memory cell MC1 comprises an n channel MOS transistor $Q_S$ having a gate being a part of a word line WL1, one conduction terminal connected to the divided bit line BL2 and other conduction terminal connected to one electrode of a capacitor $C_S$, and the capacitor $C_S$ having one elettrode connected to the other conduction terminal of the transistor $Q_S$ and other electrode connected to a memory cell plate potential $V_{SG}$. The capacitor $C_S$ stores information in the form of charges. The word line WL1 becomes an active level (an "H" level) when it is selected in response to an output from an address decoder circuit (not shown).

Figure 6A:
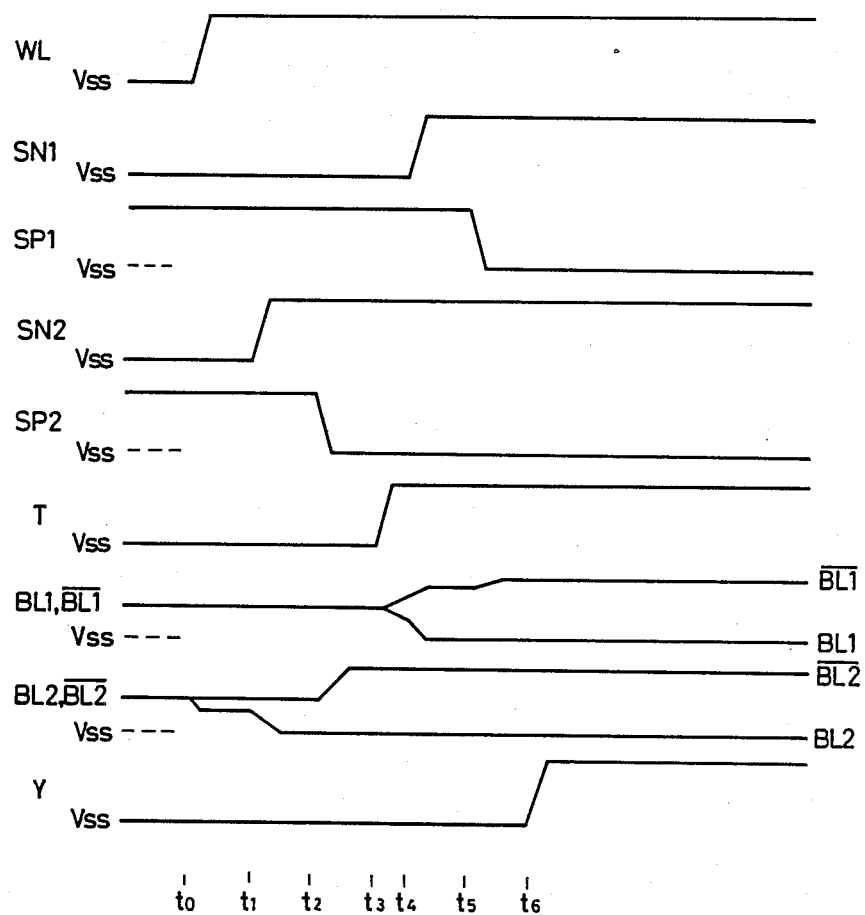
FIG. 6A is a waveform diagram showing operation of the dynamic random access memory according to the present invention when a selected memory cell stores information of "0"

FIG. 6 is a waveform diagram showing operation of the circuit shown in FIG. 5, in which information "0" is stored in the memory cell MC1. Referring now to FIGS. 5 and 6A, operation of the circuit is described.

Before the time t0, the divided bit lines BL1, $\overline{BL1}$, BL2 and $\overline{BL2}$ are precharged, so that the potential thereon becomes an intermediate potential $(V_{CC}-V_{SS})/2$. In addition, the transfer signal T applied to the transfer gate transistors QT1 an QT2 is at an "L" level, so that the divided bit lines are isolated from each other.

At the time t0, the word line WL1 is selected by address decoder means (not shown) and the potential on the word line WL1 becomes an "H" level. Thus, the transistor $Q_S$ in the memory cell MC1 is turned on, so that information "0" stored in the capacitor $C_S$ is read out to the divided bit line BL2. As a result, the potential on the divided bit line BL2 slightly lowers (the amount of change in potential is determined by the ratio of capacitance of the capacitor $C_S$ and capacitance of the divided bit line BL2), so that potential difference occurs between the pair of divided bit lines BL2 and $\overline{BL2}$.

At the time t1, the sense amplifier activating signal SP2 reaches an "L" level. Accordingly, the sense amplifier SA2 is activated. As a result, potential difference is increased between the divided bit lines BL2 and $\overline{BL2}$. More specifically, the potential on the complementary divided bit line $\overline{BL2}$ is held near an intermediate potential level, while the divided bit line BL2 at a low potential is discharged through the sense amplifier (through the transistors QN3 and QN6), so that the potential thereon becomes near the ground potential $V_{SS}$.

At the time t2, the restore circuit activating signal SP2 becomes an "L" level. Accordingly, the restore circuit driver transistor QP6 is rendered conductive, so that the restcre circuit RE2 is activated. As a result, the potential on the complementary divided bit line $\overline{BL2}$ at an intermediate potential level is pulled up near the power supply potential $V_{CC}$ through the restore circuit RE2, so that potential difference is further increased between the pair of divided bit lines BL2 and $\overline{BL2}$.

At the time t3, the transfer signal T generated from the transfer signal generator TG by being triggered by transition of the restore circuit activating signal SP2 to an "L" level becomes an "H" level. Accordingly, the transfer gate transistors QT1 and QT2 are turned on, so that the divided bit lines are connected to each other. Thus, the potentials on the divided bit line BL2 and the complementary divided bit line $\overline{BL2}$ are transferred to the divided bit line BL1 and the complementary divided bit line $\overline{BL1}$, respectively. As a result, the potential on the divided bit line begins to be discharged through the transfer gate transistor QT1 and the sense amplifier SA2, while the potential on the complementary divided bit line $\overline{BL1}$ begins to be pulled up from an intermediate potential level through the transfer gate transistor QT2 and the restore circuit RE2.

At the time t4, the sense amplifier activating signal SN1 becomes an "H" level. Accordingly, the sense amplifier driver transistor QN5 is turned on, so that the sense amplifier SA1 is activated. As a result, the divided bit line BL1 is discharged at fast speed, so that the potential thereon becomes near the ground potential $V_{SS}$.

At the time t5, the restore circuit activating signal SP1 becomes an "L" level. Accordingly, the restore circuit driver transistor QT5 is turned on, so that the restore circuit RE1 is activated. As a result, the potential on the complementary divided bit line $\overline{BL1}$ is pulled up near the power supply potential $V_{SS}$.

At the time t6, the bit line is selected by signals from column address decoder means (not shown) and the column selecting signal Y becomes an "H" level. Accordingly, the column gate transistors QY1 and QY2 are turned on, so that the pair of divided bit lines BL1 and $\overline{BL1}$ are connected to the data bus lines BU and $\overline{BU}$. As a result, the potentials on the pair of divided bit lines BL1 and $\overline{BL1}$ are transferred to the data bus lines BU and $\overline{BU}$, so that information "0" stored in the selected memory cell MC1 is read out.

The operating sequence in the sense amplifiers SA1 and SA2 and the restore circuits RE1 and RE2 is determined depending on the row address by which the memory cell is selected in the memory cell array. Thus, if the memory cell in the memory cell array CAL1 is selected, the sense amplifier SA1 and the restore circuit RE1 are activated prior to the sense amplifier SA2 and the restore circuit RE2.

Figure 6B:
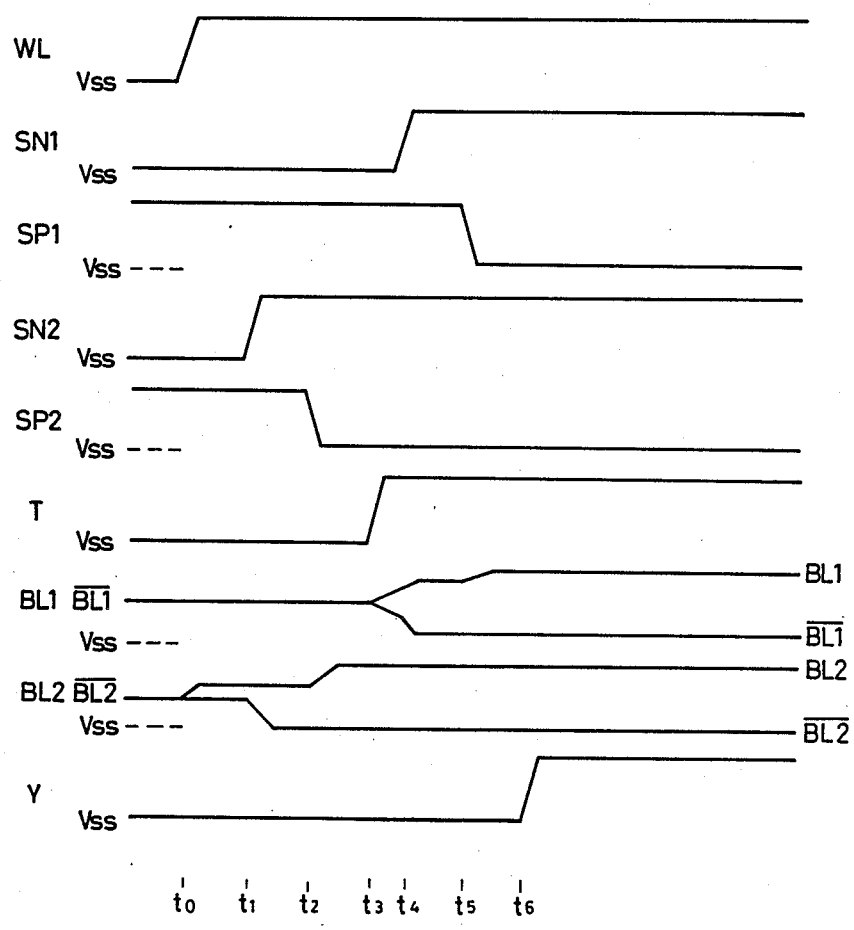
FIG. 6B is a waveform diagram showing operation of the dynamic random access memory according to the present invention when a selected memory cell stores information of "1"

FIG. 6B is a waveform diagram showing operation, showing how data is read out when the capacitor $C_S$ in the selected memory cell MC1 is charged, that is, when information "1" is stored. Referring now to FIGS. 5 and 6B, operation for reading out information "1" is described.

Precharge operation of each of the divided bit lines and each of the complementary divided bit lines as well as operation in which the transfer signal T becomes an "L" level are performed in the same manner as when the above described infommation is "0".

At the time t0, the potential on the word line WL1 selected in response to an output from decoder means (not shown) becomes an "H" level. Accordingly, the transistor $Q_S$ in the memory cell MC1 is turned on, so that information stored in the capacitor $C_S$ is read out to the divided bit line BL2. As a result, the potential on the divided bit line BL2 slightly rises, so that potential difference occurs between the pair of divided bit lines BL2 and $\overline{BL2}$.

At the time t1, the sense amplifier activating signal SN2 becomes an "H" level. Accordingly, the sense amplifier driver transistor QN6 is turned on, so that the sense amplifier SA2 is activated. As a result, potential difference is increased between the pair of divided bit lines BL2 and $\overline{BL2}$. More specifically, the potential on the divided bit line BL2 is held at a little higher potential than the intermediate potential, while the complementary divided bit line $\overline{BL2}$ is discharged through the sense amplifier SA2 (through the transistors QN4 and QN6), so that the potential thereon becomes near the ground potential $V_{SS}$.

At the time t2, the restore circuit activating signal SP2 becomes an "L" level. Accordingly, the restore circuit RE2 is activated through the transistor QP6, so that the potential on the divided bit line BL2 is pulled up near the power supply potential $V_{CC}$ through the restore circuit RE2. As a result, potential difference is further increased between the pair of divided bit lines BL2 and $\overline{BL2}$.

At the time t3, the transfer signal T generated from the transfer signal generator TG by being triggered by transition of the restore circuit aciivating signal SP2 to an "L" level becomes an "H" level. Accordingly, the transfer gate transistors QT1 and QT2 are turned on, so that the potentials on the divided bit line BL2 and the complementary divided bit line $\overline{BL2}$ are transferred to the divided bit line BL1 and the complementary divided bit line $\overline{BL1}$, respectively. As a result, the potential on the divided bit line BL1 begins to be pulled up through the transfer gate transistor QT1 and the restore circuit RE2, while caarges on the complementary divided bit line $\overline{BL1}$ begins to be discharged through the transfer gate QT2 and the sense amplifier SA2.

At the time t4, the sense amplifier activating signal SN1 becomes an "H" level. Accordingly, the sense amplifier SA1 is activated through the sense amplifier driver transistor QN5. As a result, the complementary divided bit line $\overline{BL1}$ is discharged at fast speed, so that the potential thereon becomes near the ground potential $V_{SS}$.

At the time t5, the restore circuit activating signal SP1 becomes an "L" level. As result, the potential on the divided bit line BL1 is pulled up near the power supply potential $V_{CC}$ through the restore circuit RE1 which is in an active state.

At the time t6, the column selecting signal Y from address decoder means (not shown) becomes an "H" level and the bit line thereof is selected. Accordingly, the column gate transistors QY1 and QY2 are turned on. As a result, the potential on the pair of divided bit lines BL1 and $\overline{BL1}$ are transferred to the data bus lines BU and $\overline{BU}$, respectively, so that information "1" stored in the memory cell MC1 is read out.

Figure 7:
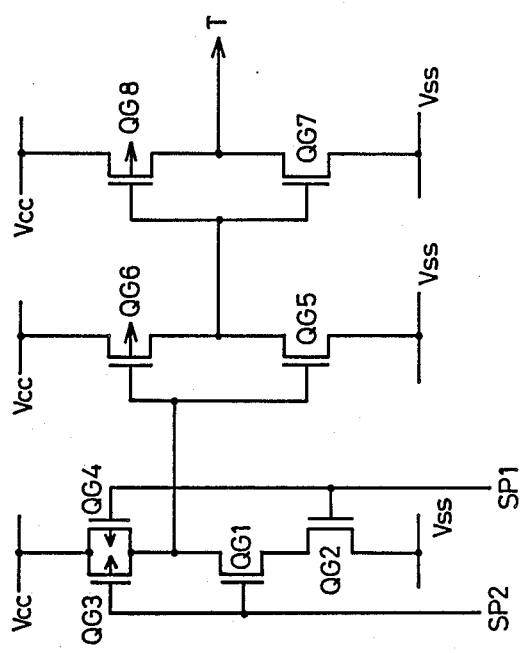
FIG. 7 is a circuit diagram showing a specific structure of a transfer signal generator shown in FIG. 5.

FIG. 7 is a diagram showing an example of a specific structure of the transfer signal generator shown in FIG. 5. In FIG. 7, an NAND gate comprises p channel MOS transistors QG3 and QG4 and n channel MOS transistors QG1 and QG2. The transistors QG3 and QG4 have gates receiving the restore circuit activating signals SP2 and SP1, respectively, and one conduction terminals connected to each other and the power supply potential $V_{CC}$ and other conduction terminals connected to an output terminal. The n channel MOS transistor QG1 has one conduction terminal connected to the output terminal, a gate receiving the restore circuit activating signal SP2 and other terminal connected to one conduction terminal of the MOS transistor QG2. The n channel MOS transistor QG2 has one conduction terminal connected to the other conduction terminal of the MOS transistor QG1, a gate receiving the restore circuit activating signal SP1 and other terminal connected to the ground potential $V_{SS}$.

A first inverter circuit comprises a p channel MOS transistor QG6 and an n channel MOS transistor QG5 connected in a complementary manner and having gates receiving an output of the NAND gate. The p channel MOS transistor QG6 has one conduction terminal connected to the power supply potential $V_{CC}$, while the n channel MOS transistor QG5 has other conduction terminal connected to the ground potential $V_{SS}$.

A second inverter comprises a p channel MOS transistor QG8 and an n channel MOS transistor QG7 connected in a complementary manner and having gates receiving an output of the first inverter circuit. The p channel MOS transistor OG8 has one conduction terminal connected to the power supply potential $V_{CC}$, while the n channel MOS transistor has other conduction terminal connected to the ground potential $V_{SS}$. The second inverter circuit provides the transfer signal T.

According to the above described circuit structure, if either the restore circuit activating signal SP1 or SP2 becomes an "L" level, the transfer signal T is triggered to be an "H" level. More specifically, in, for example, FIG. 6, at the time t2, the restore circuit activating signal SP2 eecomes an "L" level. Accordingly, the potential difference on the pair of divided bit lines BL2 and $\overline{BL2}$ is increased and is stabilized. Thereafter, at the time t3, the transfer signal becomes an "H" level. Accordingly, the pair of divided bit lines are connected to each other. As a result, the effect of noise on the bit lines can be removed and noise margin is increased.

Although in the above described embodiment, the sense amplifier comprises an n channel MOS transistor and a restore circuit comprises a p channel MOS transistor, they may comprise transistors each having opposite conductivity type if polarity of activating signals is suitably selected, in which case the same effect as the above described embodiment can be obtained.

In addition, although in the above described embodiment, a taansfer gate transistor and a column gate transistor comprise an n channel MOS transistor, they may comprise transistors of different conductivity type if signals applied to the gates are suitably selected, in which case the same effect as the above described embodiment can be obtained.

Furthermore, although in the above described embodiment, a selecting transistor in a memory cell comprises an n channel MOS transistor, it may comprise a p channel MOS transistor if the potential of the word line is suitably selected, in which case the same effect as the above described embodiment can be obtained.

Although in the above described embodiment, a transfer signal generator comprises an NAND gate and a two-stage inverter circuit, any circuit structure generating a transfer signal which becomes an active level by being triggered by signals first being an active level out of restore circuit activating signals may be used, in which case the same effect as the above described embodiment can be obtained. For example, the transfer signal generator may comprise an inverter circuit comprising a number of, other than two, stages, only an NAND gate, or the other circuit configuration.

Although in the above described embodiment, a pair of bit lines are divided into two blocks, the number of the divided blocks is not limited to two. The pair of bit lines may be divided into the other number of blocks, in which case the same effect as the above described embodiment can be obtained.

According to the present invention as described in the foregoing, since a sense amplifier and a restore circuit are provided for each pair of divided bit lines, and a transfer gate transistor for connecting the divided bit lines to each other is turned on in response to signals generated by being triggered by signals for activating a restore circuit first activated out of restore circuits each connected to a divided bit line (a complementary divided bit line) connected to the transfer gate transistor, the sense operation can be performed in a fast and stable manner, operation margin of a semiconductor memory is increased and the gate potential applied to a transfer gate transistor need not be boosted over the power supply potential, so that reliability of a gate oxide film is improved and correspondingly, reliability of the semiconductor memory is improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory comprising:
   a plurality of word lines;
   a plurality of pairs of bit lines with a folded bit line structure, each one of said pair of bit lines divided into a plurality of blocks, and each bit line of a pair of bit lines forming divided bit lines;
   a plurality of memory cells each connected to a corresponding word line of said plurality of word lines and a corresponding divided bit line of said plurality of pairs of bit lines;
   a plurality of sense amplifiers provided for each of the pairs of bit lines divided into said plurality of blocks for detecting and amplifying a difference between signal levels on the corresponding pair of divided bit lines after a particular word line is selected from said plurality of word lines;
   a plurality of restore circuit provided for each of the pairs of bit lines divided into said plurality of blocks for detecting and further amplifying said difference between signal levels amplified by said sense amplifiers on a corresponding pair of divided bit lines;
   first switching means provided for each of said divided bit lines for electrically connecting adjacent divided bit lines to each other;
   a control circuit for generating activating signals for sequentially activating said plurality of restore circuits in a predetermined order beginning at a restore circuit provided in a block including said selected word line; and
   switch control means responsive to said activating signals for controlling an operation of said first switching means, said switch control means responsive to one of said activating signals to render said first switching means conductive.

2. A semiconductor memory in accordance with claim 1, wherein said first switching means (QT1, QT2) comprise a transfer gate including a transfer transistor.

3. A semiconductor memory in accordance with claim 1, wherein said switch control means comprises a NAND gate having inputs receiving said activating signals.

4. A semiconductor memory in accordance with claim 3, wherein said switch control means (TG) further includes inverter circuits (TG2, TG3) for receiving and inverting output signals from said NAND gate.

5. A semiconductor memory in accordance with claim 1, wherein only a pair of divided bit lines out of a plurality of pairs of divided bit lines constituting said each pair of bit lines are connected to a data bus line through second switching means (QY1, QY2).

6. A semiconductor memory in accordance with claim 5, wherein said second switching means (QY1, QY2) is rendered conductive after all the sense amplifiers (SA1, SA2) and the restore circuits (RE1, RE2) each connected to each of the pairs of divided bit lines constituting said each pair of bit lines are activated.

7. A semiconductor memory in accordance with claim 5, wherein said second switching means (QY1, QY2) comprise a transfer gate including a transistor.

8. A semiconductor memory in accordance with claim 5, wherein said second switching means (QY1, QY2) are rendered conductive in response to signals for selecting the pairs of bit lines.

* * * * *